United States Patent [19]

Ayala

[11] Patent Number: 5,619,192
[45] Date of Patent: Apr. 8, 1997

[54] APPARATUS AND METHOD FOR READING UTILITY METERS

[75] Inventor: Raymond F. Ayala, San Diego, Calif.

[73] Assignee: Logicon, Inc., Torrence, Calif.

[21] Appl. No.: 259,723

[22] Filed: Jun. 14, 1994

[51] Int. Cl.$^6$ .................................................. G08B 23/08
[52] U.S. Cl. ........................... 340/870.02; 340/870.18; 340/870.31; 340/825.54; 324/103 R; 324/142; 364/483
[58] Field of Search .................... 340/505, 870.02, 340/870.03, 870.18, 870.31, 870.4, 825.54; 324/115, 127, 142, 103 R; 455/41, 66, 106; 364/464.04, 483

[56] References Cited

U.S. PATENT DOCUMENTS

| | | | |
|---|---|---|---|
| 3,754,250 | 8/1973 | Bruner | 340/870.03 |
| 3,806,904 | 4/1974 | Weinberger et al. | 340/870.02 |
| 3,914,757 | 10/1975 | Finlay, Jr. et al. | 381/19 |
| 4,008,458 | 2/1977 | Wensley | 340/870.02 |
| 4,035,772 | 7/1977 | Abe et al. | 340/870.03 |
| 4,085,287 | 4/1978 | Kullman et al. | 340/870.02 |
| 4,132,981 | 1/1979 | White | 340/870.02 |
| 4,196,417 | 4/1980 | Fasching et al. | 340/870.04 |
| 4,208,653 | 6/1980 | Abe | 340/870.02 |
| 4,352,104 | 9/1982 | Mizuta et al. | 340/870.02 |
| 4,361,838 | 11/1982 | Mizuta | 340/870.02 |
| 4,463,354 | 7/1984 | Sears | 340/870.02 |
| 4,504,831 | 3/1985 | Jahr et al. | 340/870.02 |
| 4,532,510 | 7/1985 | Bertrand et al. | 340/870.31 |
| 4,569,045 | 2/1986 | Schleble et al. | 340/310.02 |
| 4,573,041 | 2/1986 | Kitagawa et al. | 340/505 |
| 4,578,540 | 3/1986 | Borg et al. | 399/107 |
| 4,646,084 | 2/1987 | Burrows et al. | 340/870.03 |
| 4,652,855 | 3/1987 | Weikel | 340/870.02 |
| 4,652,877 | 3/1987 | Gray | 340/870.02 |
| 4,707,852 | 11/1987 | Jahr et al. | 340/870.03 |
| 4,758,836 | 7/1988 | Scuilli | 340/870.02 |
| 4,782,341 | 11/1988 | Gray | 340/870.02 |
| 4,803,632 | 2/1989 | Frew et al. | 340/870.02 |
| 4,852,152 | 7/1989 | Honick | 379/106 |
| 5,111,407 | 5/1992 | Galpern | 340/870.02 |
| 5,155,481 | 10/1992 | Brennan, Jr. et al. | 340/870.02 |
| 5,243,338 | 9/1993 | Brennan, Jr. et al. | 340/870.02 |
| 5,252,967 | 10/1993 | Brennan, Jr. et al. | 340/870.02 |
| 5,270,704 | 12/1993 | Quintnan et al. | 340/870.03 |
| 5,278,551 | 1/1994 | Wakatsuki et al. | 340/870.02 |
| 5,345,231 | 9/1994 | Koo et al. | 340/870.31 |
| 5,355,513 | 10/1994 | Clarke et al. | 340/870.02 |
| 5,523,751 | 6/1996 | Byford et al. | 340/870.02 |

FOREIGN PATENT DOCUMENTS 2138609 of 0000 United Kingdom .

OTHER PUBLICATIONS

Article by Pravdic et al. (Microcomputer System for Pulse Data Acquisition, Recording, Local Processing and Remote Data Trasmission, IECON '86 Sep. 29–Oct. 3, 1986, vol. 1, pp. 327–332).

Primary Examiner—Thomas Mullen
Assistant Examiner—Daniel J. Wu
Attorney, Agent, or Firm—Burns, Doane, Swecker and Mathis, L.L.P.

[57] ABSTRACT

An electronic meter reader having a transmitter and antenna for inductively transmitting alternating current power in any selected one of a plurality of frequencies. The reader further includes a receiver for inductively receiving meter reading data from the meter being read represented by a load modulation of the transmitted frequency. A bandpass filter limits the bandwidth of the modulation frequency. The power transmitted by the transmitter may also be used by the meter to generate and transmit data representative of the meter reading back to the reader. A second receiver is also provided for inductively receiving reading data from the meter in the form of a modulated frequency generated by the meter. The reader includes a microprocessor and program which control the generation of a plurality of interrogation signal formats, and which decode a plurality of received data formats.

25 Claims, 6 Drawing Sheets

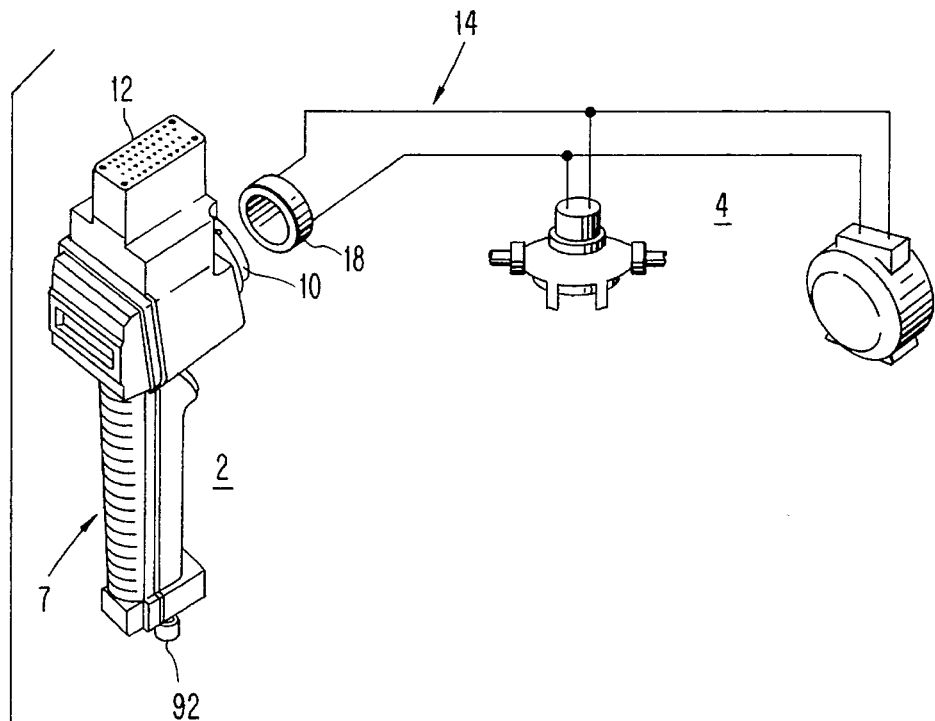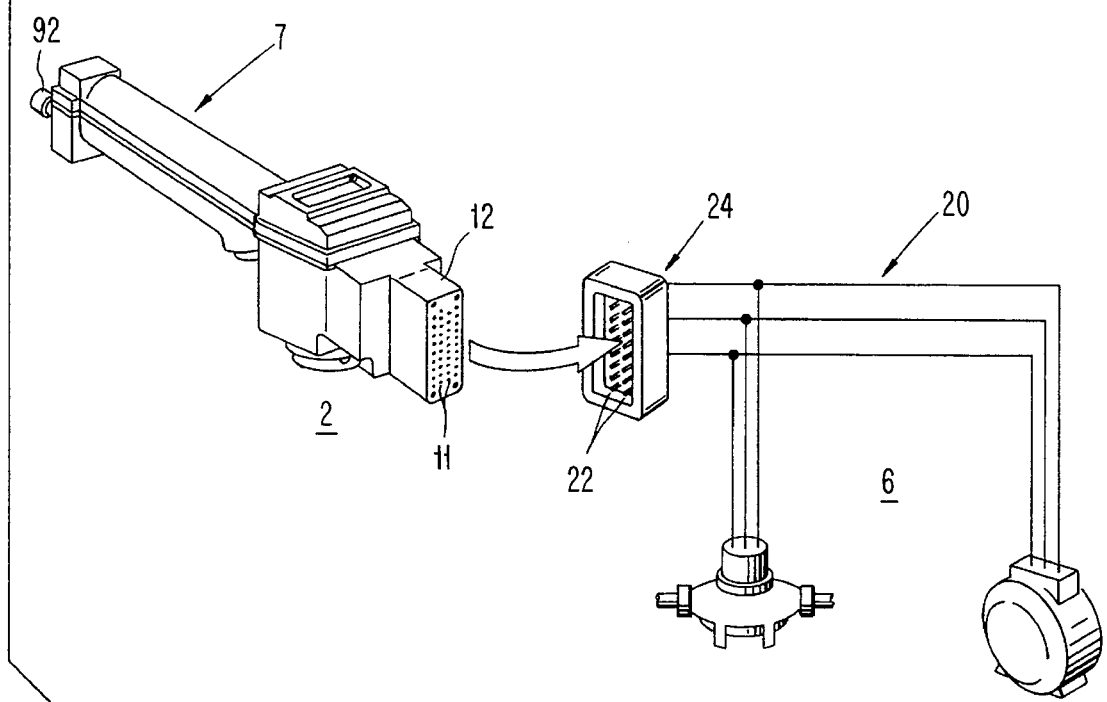
Fig. 1

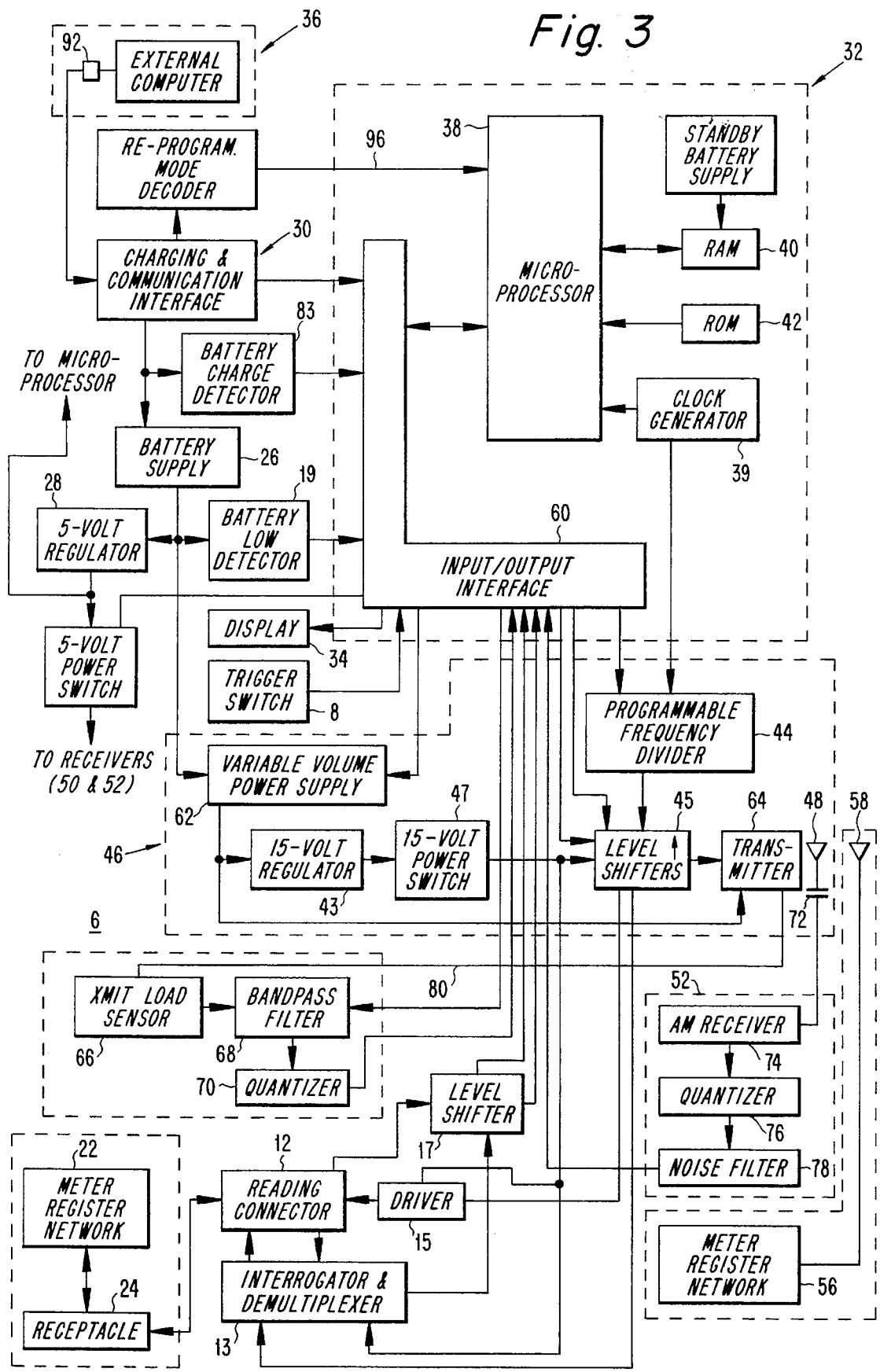

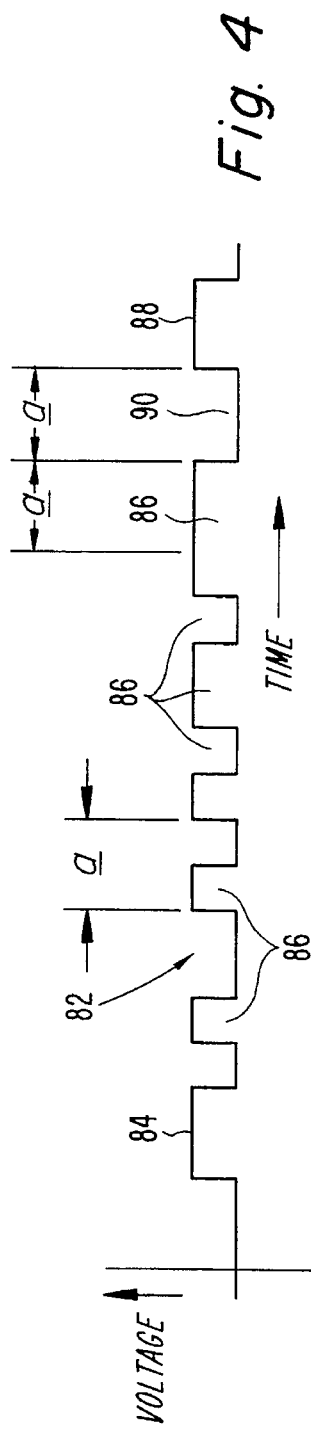
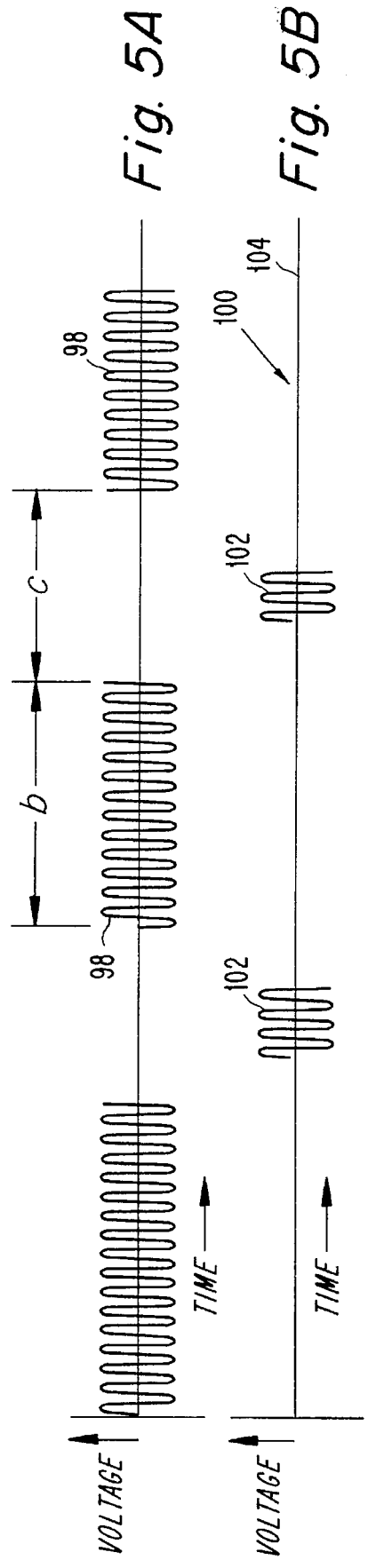
Fig. 4
Fig. 5A
Fig. 5B
Fig. 5C

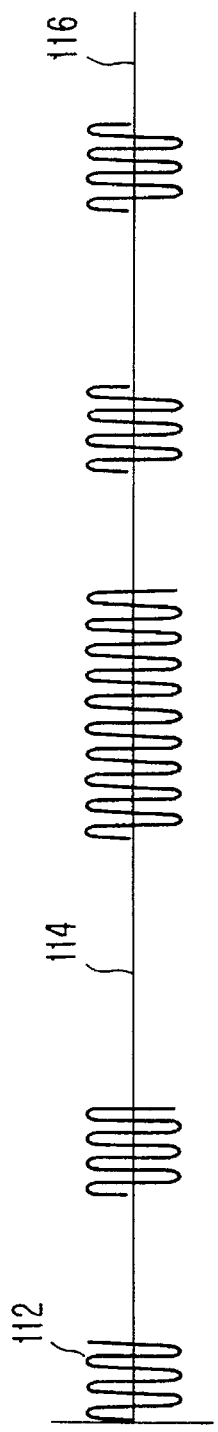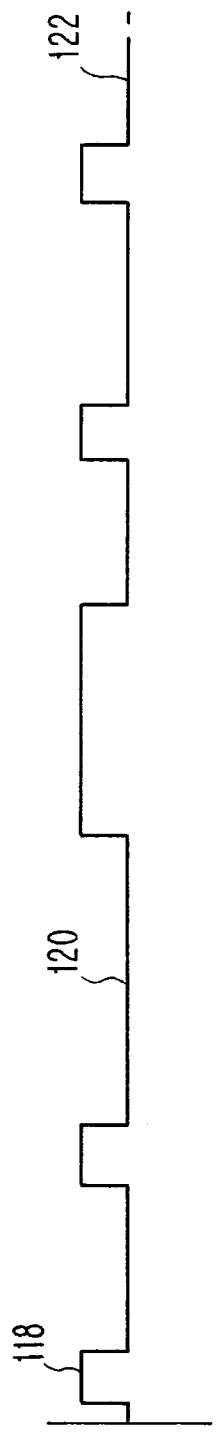

APPARATUS AND METHOD FOR READING UTILITY METERS

FIELD OF THE INVENTION

The invention relates to the reading of utility meters and more particularly to a reader capable of receiving meter reading data through an inductive connection or through a direct wire connection.

DESCRIPTION OF THE PRIOR ART

Utility meters are currently typically read by an individual referred to as a "meter reader", who follows a designated route and visually reads the utility meters of facilities along that route. The meter reader keys the readings into a hand held computer for later downloading into a host billing computer.

There is a trend, however, to electronic meter reading using hand held electronic readers which are carried and activated by the meter reader. In order to use the electronic reader, a register is connected to the meter to be read which provides data representative of the reading of the meter to the electronic reader when the latter is placed adjacent to and transmits an interrogation signal to the register. The electronic reader receives the reading data from the register either through an inductive coupling between coils or antennas of the reader and the register or through a direct wire contact of the reader with the register. The meter thus transmits meter identification data, the reading data, and other related data, through its register to the hand held electronic reader. This process eliminates the need to key the reading data into the electronic reader, which is a common source of error. It also greatly speeds up the meter reading process through the electronic data reading process and through greater data accessibility provided by the register.

Each meter manufacturer provides electronic readers for its meters which are a proprietary product of that manufacturer. Consequently, each meter reader and the meter register it operates with will have different electrical interfaces and data protocols from those of the manufacturer's competitors. This creates the problems for utilities of requiring its reading personnel to carry a different, appropriate, electronic reader for each type of meter to be read or to purchase only one type of meter from a manufacturer thereby giving up the benefit of competitive multiple suppliers.

SUMMARY OF THE INVENTION

It is a general object of the present invention to provide an electronic reader for utility meters that will read all major types of utility meters currently available. It is a further object of the invention to provide an electronic reader which will receive meter reading data in the form of both modulated induced signals and induced signals generated by the meter being read.

The invention is accomplished by providing an electronic reader having means for conductively and inductively transmitting power and/or an interrogation command to a meter to be read at any selected one of a plurality of frequencies. The reader further includes a receiver which receives data inductively from the meter being read represented by a modulation of the transmitted frequency of the transmitter means. A bandpass filter may be further provided for limiting the bandwidth of the modulated frequency. The transmitting means of the reader also is operative to transmit power to the meter which is used by the meter to, in turn, generate and transmit data representative of the meter reading to a receiver at the reader. The reader thus further includes a second receiver for inductively receiving data from the meter in the form of a modulated carrier frequency generated by the meter. In addition, the reader includes interface means for providing conductive coupling to a meter to supply power to the meter and receive data from the meter in either serial or parallel format.

The reader also includes a memory and a microprocessor for controlling the transfer of a program into the memory. For use with the transfer of the program into the memory, the reader includes a means for receiving a charging signal when the internal battery of the reader is being charged and also receiving a programming signal. The means for receiving these two signals produces a program mode signal to the microprocessor which causes the microprocessor to initiate the transfer of the program into the memory.

In addition, the reader includes converter means for converting meter reading data from an analog to a digital form. The converting operation of the converter is controlled by a program in a reader memory. Also disclosed as part of the reader is translator means for translating the various meter data formats to a single common data format for use by the display and an external computer. The translation process of the translator is performed entirely by the microprocessor and is controlled by a program in the reader memory.

BRIEF DESCRIPTION OF THE DRAWINGS

Further objects and advantages of the present invention will appear from the following detailed description of the preferred embodiments, when read in conjunction with the accompanying figures of the drawing wherein:

FIG. 1 illustrates the electronic reader according to the invention, the meters which it reads and the circuits to which they are connected, and the devices for connecting the reader to the circuits;

FIG. 3 is a schematic circuit diagram of the electronic reader according to the invention and external electrical devices to which it is connected including the meters to be read;

FIG. 4 is a diagram of data representing a meter reading;

FIG. 5A is a diagram representing power at a designated frequency transmitted by the reader to a meter to be read;

FIG. 5B is a diagram of a frequency signal transmitted by the meter being read to the reader;

FIG. 5C is a diagram of meter reading data produced by the reader in response to the signal transmitted from the meter as shown in FIG. 5B; and FIG. 6A is a diagram of a frequency signal transmitted by the meter being read to the reader; and FIG. 6B is a diagram of meter reading data produced by the reader in response to the signal transmitted from the meter as shown in FIG. 6A.

DETAILED DESCRIPTION OF THE INVENTION

Figure 2A:
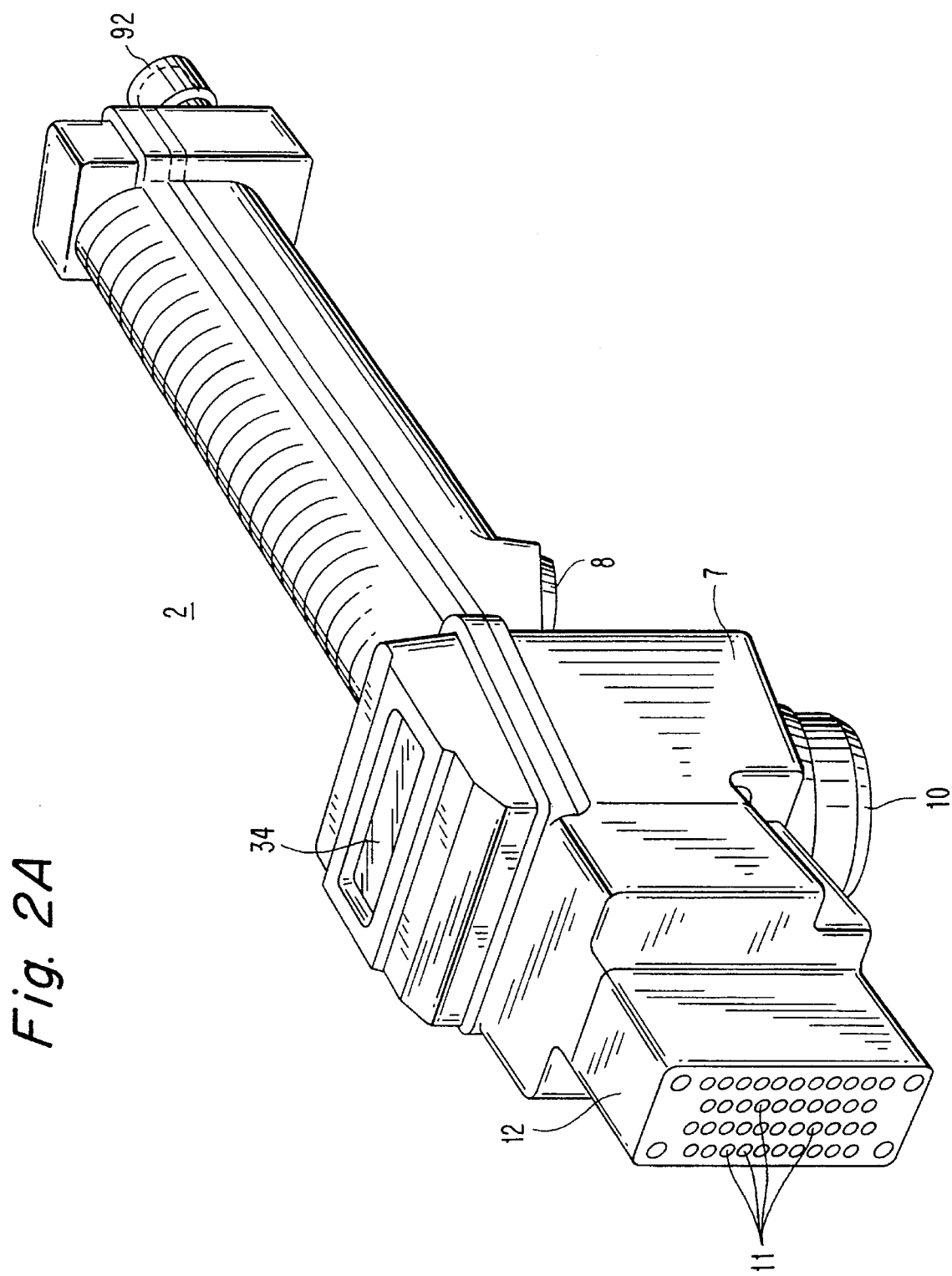
FIG. 2A is a perspective view of the electronic reader according to the invention.
Figure 2B:
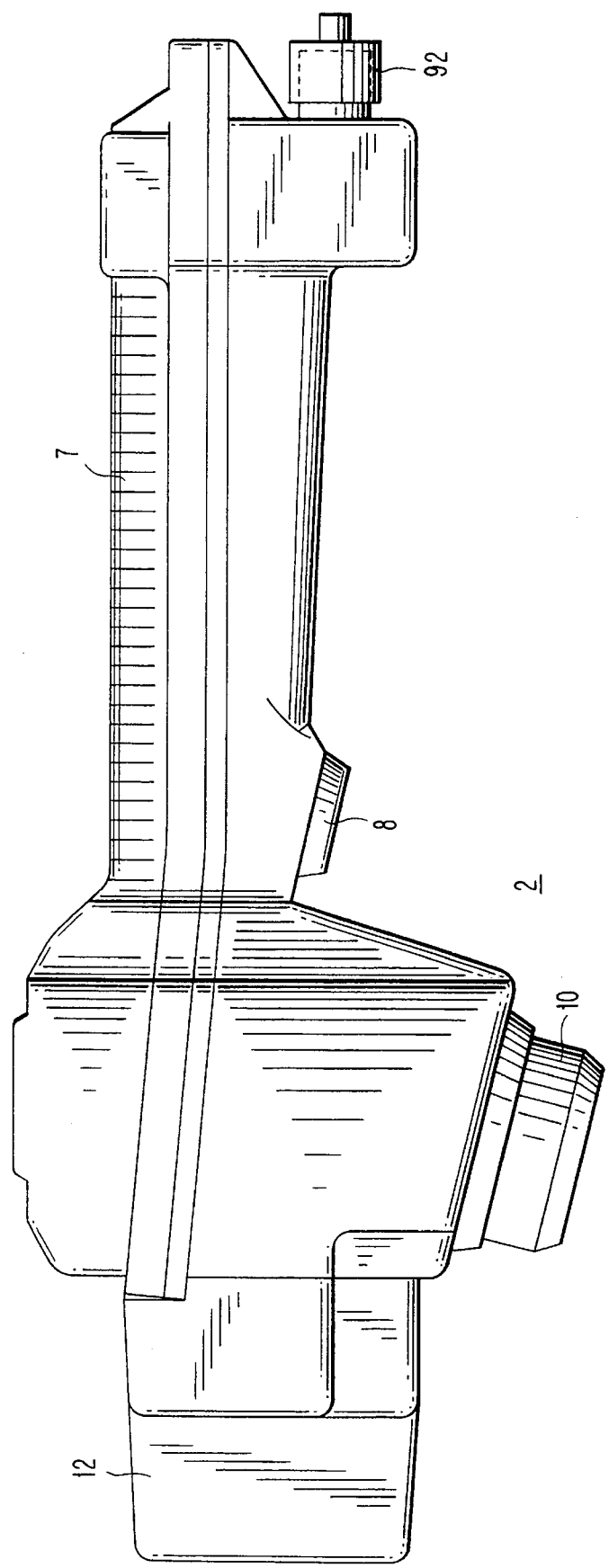
FIG. 2B is a front end view of the reader shown in FIG. 2A.

With reference to FIGS. 1, 2A, 2B and 3 of the drawing, an electronic reader 2 for reading utility meters such as meters 4 and 6 either by means of an induced signal or by a directly conducted signal is illustrated. The reader 2 includes a housing 7, an operating trigger switch 8, and a reading probe 10. The reader also includes a detachable reading connector 12 having receivers 11 for making a direct electrical pin connection when reading is by means of a direct electrical signal to the reader 2. When one of the utility meters 4 is to be read through the inductively coupled circuit 14 to which it is connected, the reading probe 10 is placed in approximate contact with the reading port 18 which is connected to the meter 4 through the circuit 14. If one of the meters 6 connected to a conductively coupled circuit 20, is to be read, the reading connector 12 is inserted into the receptacle 24 which is also connected to the circuit 20. In this insertion, the pins 22 of the receptacle 24 enter the pin receivers 13 in the connector 12.

The reader 2 further includes a primary battery supply 26, a voltage regulator 28, a battery charging interface 30, a control circuit 32, and a display 34. As will be discussed in greater detail hereinafter, the control circuit 32 includes a microprocessor having a clock generator 39, a random access memory (RAM) 40, a read only memory (ROM) 42, and an input/output interface 60. The reader 2 also includes a programmable frequency divider 44, digital level shifter 45, a 15-volt power regulator 43 with an output control switch 47, an interrogation circuit 46 having an antenna 48 located in the reading probe 10, a load sensing receiver 50, and an amplitude modulated signal receiver 52. The interrogation circuit 46 includes a transmitter 64 and a microprocessor-controlled variable voltage power supply 62 connected to the battery supply 26 for providing power to the interrogation circuit. The transmitter generates an A.C. carrier wave which is connected to the antenna 48. The transmitter's output power level is set to the level appropriate for the meter being read by setting the output level of the variable voltage power supply 62 to an appropriate voltage. The variable voltage power supply is controlled by a program in control circuit 32. The load sensing receiver 50 includes a transmit load sensor 66 connected by line 80 to the power return circuit of the transmitter, a bandpass filter 68, and a quantizer 70. The interrogation circuit 46, the load sensing receiver 50 (through the transmitter 64) and the amplitude modulated signal receiver 52 are inductively connected by means of antenna 48 to the meter register network 56 of meter 4 via the antenna 58 of meter 4. The antenna 58 is positioned in port 18 closely adjacent to the antenna 48 when the probe 10 is placed in approximate contact with the port 18. The microprocessor 38 is connected via interface circuits 60, 45, 13, 15 and 17 through the reading connector 12 and receptacle 24 to the meter register network 22 of meter 6. In FIG. 3, where single lines are shown connecting various components, each line represents one or more electrical lines as required to provide the necessary electrical signals or power. The amplitude modulated signal receiver 52 includes an amplitude modulated "AM" receiver 74, a quantizer 76, a noise filter 78, and a capacitor 72 for decoupling the DC voltage at the output of the transmitter 64. The load sensing receiver 50 and amplitude modulated signal receiver 52 both communicate through interface 60 with the microprocessor 38.

The reader 2 is portable and carried by an operator as he makes his rounds to read meters along a predesignated route. If the meter to be read has an inductively coupled meter register of a type such as network 56, the operator will place the reading probe 10 of the reader 2 in approximate contact with the reading port 18 containing the antenna 58 of the meter register network 56 and quickly depress and release the trigger switch 8 to initiate a meter reading. If the meter to be read utilizes a meter register network of the type such as network 22 which is connected to a conductively coupled circuit through a receptacle 24, the operator will insert the reading connector 12 in the receptacle 24 so that a direct electrical connection by the engagement of the pins 22 and receivers 11 is made to transmit the meter reading to the reader 2.

The depressing and releasing of the trigger switch 8 causes a signal, through the interface 60, to be transmitted to the microprocessor 38 which results in the microprocessor instructing the programmable frequency divider 44 to control the transmitter 64 to produce one of six possible continuous or pulse width modulated carrier frequencies. The microprocessor 38 also, through the interface 60, causes the power supply 62 to provide power to the transmitter 64 so that the transmitter output produces an interrogation signal driving the antenna 48 at the frequency directed by the programmable frequency divider 44. The programmable frequency divider 44 will produce either a continuous or a pulse signal as directed by the microprocessor program in RAM 40 and as is appropriate for the type of meter being read. The transmitted carrier frequency from the transmitter 64 to the antenna 48 is induced in the antenna 58 of the meter register network 56 so that the network 56 is turned "on" in response to the interrogation signal and provides data indicating a reading of its meter. For some types of meters, the meter register network 56 provides the reading data of the meter 4 of which it is a part by selectively loading the carrier frequency to decrease its voltage amplitude by drawing power to represent a "one" bit of information but not drawing power so that the carrier amplitude is not decreased to represent a "zero" bit of information.

The power drawn by the network 56 is sensed through the inductive coupling of the antennas 48 and 58 by the load sensor 66 through its connection 80 to the power return line of the transmitter 64. The load modulated carrier frequency sensed by the load sensor 66 is transmitted to the bandpass filter 68 which passes a designated frequency bandwidth which is programmable by a program contained in the RAM 40. The programmed bandwidth is determined by the frequency bandwidth required by the meter register network 56 to transmit the meter reading data and is set at the bandwidth required to extract eh meter's data signal from the combined transmit and data signals. The bandpass filter 68 filters out the carrier frequency and transmits to the quantizer 70 what is essentially a wave of the envelope of the load modulated carrier frequency. The quantizer 70 identifies the voltage transition changes resulting from the modulation of the carrier and, in response, generates a series of logic bits comprising a signal 82, having "one" bits or "zero" bits as shown in FIG. 4. In generating the bit signal 82 from the wave form received from the bandpass filter, the quantizer 70 establishes the median level of the wave form between the transition changes (which vary from meter to meter and may be very small), determines when the signal is above or below the median, and produces a larger amplitude, clearer bit logic signal 82. For currently marketed power modulation type meters, each bit width a in FIG. 4 is 0.85 millisecond where the carrier frequency transmitted by the transmitter 64 is 19,200 hertz. For meters which generate biphase encoded data, each "one" bit 82 of information during a bit width a is indicated by a wave form in which there is a transition during the bit width and each "zero" bit 82 is indicated by a wave form in which there is no transition during the width a of the bit. Conversion of a biphase encoded signal to the format shown in FIG. 4 is performed by the microprocessor 38 under the control of the program in RAM 40. In the information transmitted by the bits in FIG. 4, there is an initial zero start bit 84, 7 bits 86 which represent one ASCII character, a parity bit 90 following the last data bit 86, and a stop bit 88. This signal 82 comprising a series of bits is transmitted to the interface 60 which, in turn, produces a signal to the microprocessor 38 for storing in the RAM 40 as data indicative of the meter reading provided by the meter register network 56.

Another method of transmitting data representative of a meter reading by the meter register network 56 through the inductive communication of the antennas 58 and 48 is based on a signal form originated by the network 56 which does not require modulation of the transmitted signal from the reader 2 but which does require power for its operation from the reader 2. In this approach, when the trigger switch 8 is depressed momentarily, the microprocessor 38 through the interface 60 causes the transmitter 64 to transmit power to the antenna 48 at a frequency directed by the programmable frequency divider 44, for example 27,930 hertz. Through the inductive communication between the antennas 48 and 58, power at this frequency is provided to the network 56. The length of the transmission signal to the network 56 is as required to provide sufficient power to the network 56 to permit it to produce a return signal to the reader 2 indicative of a part of the data representative of a meter reading. Following a transmission of data from the network 56 back to the reader 2 through the inductive coupling of the antennas, power is again transmitted from the transmitter 64 to the network 56 and the network 56 responds with another portion of the data representative of the meter reading. This power transmission and data transmission sequence continues so that the data transmission portion of the sequence provides a series of groups of signals 100 comprising a start bit, 7 data information bits representing one ASCII character, a parity bit and a stop bit, until the transmission of all data concerning the meter reading is completed. With reference to FIGS. 5A and 5B, an example of the transmission of power from the transmitter 64 at 27,930 hertz to the network 56 is illustrated in FIG. 5A in which the power transmission segments 98 have a length b representative of 2.7 to 4.5 milliseconds and the time between power transmission segments has a length c of 1.5 milliseconds. The return data information signal 100 from the network 50 comprises signals 102 in which a frequency is transmitted, and signals 104 in which a frequency is not transmitted, each of which follow a power transmission segment from the transmitter 64. A signal 102 comprising a frequency transmission is indicative of a "zero" bit of information and a signal 104 comprising a lack of such a transmission is indicative of a "one" bit of information. The AM receiver 74 receives the return data information signal 100 as shown in FIG. 5B from the network 56, amplifies this signal and passes it to the quantizer 76. The quantizer 76 determines when the amplitude of each signal 102 and 104 is above or below a fixed threshold and produces a clear logic signal 106 comprising one bits 108 and zero bits 110 as shown in FIG. 5C. The transmittal of the groups of signals 100 thus results in the producing of a corresponding group of signals 106 each having a plurality of bits 108 and 110 comprising a start bit, 7 bits of data information representative of one ASCII character, a parity bit and a stop bit. These signals 106 are passed from the quantizer 76 through a noise filter 78 to the interface 60 which, in turn, produces corresponding signals to the microprocessor 38 resulting in data being stored in the RAM 40 representative of the reading of the meter connected to the network 56.

Data representative of a meter reading may also be transmitted by the meter register network 56 through the inductive communication of the antennas 58 and 48, using a signal form originated by the network 56 in which power for the network 56 is supplied by a battery (not shown), and which does not require modulation of the transmitted signal from the reader 2 or power for its operation from the reader 2. In this approach, when the trigger switch 8 is depressed momentarily, the microprocessor 38 through the interface 60 causes the transmitter 64 to transmit an interrogation pulse to the antenna 48 at a frequency directed by the programmable divider 44, for example a pulse burst at 153,600 hertz with a duration of eight milliseconds. Through the inductive communication between the antennas 48 and 58, this signal is provided to the network 56. The length of the transmission signal to the network 56 is as required to provide stimulation to the network 56 to induce it to produce a return data information signal 116 to the reader 2 indicative of the data representative of a meter reading and meter identification. The data information signal 116 includes a signal 112 comprising a frequency transmission indicative of a "one" bit of information and a signal 114 comprising a lack of such a transmission indicative of a "zero" bit of information. The AM receiver 74 receives the return data information signal 116 as shown in FIG. 6A from the network 56, amplifies this signal and passes it to the quantizer 76. The quantizer 76 determines when each signal 112 and 114 is above or below a fixed amplitude threshold and produces a clear logic signal 122 comprising one bits 118 and zero bits 120, as shown in FIG. 6B. The transmittal of the signal 116 thus results in the producing of a corresponding signal 122 having a plurality of bits 118 and 120 comprising a 4 bit preamble, 27 bits of identification information, 1 space bit, 3 prescale bits, 20 data bits, 2 security bits, and 6 postamble bits. The signal 122 is passed from the quantizer 76 through a noise filter 78 to the interface 60 which, in turn, produces corresponding signals to the microprocessor 38 resulting in data being stored in the RAM 40 representative of the reading of the meter connected to the network 56. The width of each bit is determined by dividing the total elapsed time of the transmission by the total number of bits.

Another method of transmitting data representative of a meter reading by the meter register network 56 through the inductive communication of the antennas 58 and 48 is based on another signal form originated by the network in which power for the network 56 is supplied by a battery (not shown) and which does not require modulation of the transmitted signal from the reader 2 or power for its operation from the reader 2. In this approach, when the trigger switch 8 is depressed momentarily, the microprocessor 38 through the interface 60 causes the transmitter 64 to transmit a series of amplitude modulated interrogation messages to the antenna 48 at a frequency directed by the programmable frequency divider 44, for example 61,440 hertz. A frequency transmission 3.33 milliseconds long is indicative of a "one" bit of information and a lack of such a transmission for 33.3 milliseconds is indicative of a "zero" bit of information. Each message comprises a sequence of eight coded characters, each in turn comprising 1 start bit, 8 data bits and 1 stop bit. Through the inductive communication between the antennas 48 and 58, these messages are transmitted to the network 56. The data encoded in each message transmitted to the network 56 provides stimulation to the network 56 to induce it to produce the return data information signal 116 to the reader 2 indicative of part of the data representative of a meter reading and meter identification. The data information signal 116 includes a signal 112 comprising a frequency transmission 3.33 milliseconds long indicative of a "one" bit of information and a signal 114 comprising a lack of such a transmission for 3.33 milliseconds indicative of a "zero" bit of information. The AM receiver 74 receives the return data information signal 116 as shown in FIG. 6A from the network 56, amplifies this signal and passes it to the quantizer 76. The quantizer 76 determines when each signal 112 and 114 is above or below a fixed amplitude threshold and produces a clear logic signal 122 comprising one bits 118 and zero bits 120, as shown in FIG. 6B. The transmittal of the signal 116 thus results in the producing of the corresponding signal 122 having a plurality of bits 118 and 120 comprising a sequence of eight coded characters, each in turn comprising 1 start bit, 8 data bits and 1 stop bit. The signal 122 is passed from the quantizer 76 through a noise filter 78 to the interface 60 which, in turn, produces corresponding signals to the microprocessor 38 resulting in data being stored in the RAM 40 representative of the reading of the meter connected to the network 56. Identification and interpretation of these signals is performed by the microprocessor under a program control.

With respect to both the load sensing receiver 50 and the amplitude modulated signal receiver 52, the formation of the logic signals representative of the meter reading data is accomplished with the use of the program contained in the RAM 40. Thus, by changing the program in the RAM 40 to process the different types and forms of data containing signals from different meters, the reader 2 can be used in the reading of a wide variety of meters. In general, the data formats transmitted from meters and also the power and interrogation formats transmitted from the reader 2 will vary, but a wide variety of interrogation and power transmission formats can be selected by the reader and a wide variety of data formats from the meter can be decoded by the use of the microprocessor 38 and the program in memory 40.

Considering reading of the meter 6, direct wire connections between the meter register network 22 and the microprocessor 38 are made through interface elements 60, 45, 13, 15, and 17, the reading connector 12 and receptacle 24. In this mode of operation, an interrogation signal is supplied to the network 22 when the trigger switch 8 is momentarily depressed. The network 22 responds with meter identification and meter reading data in the form of groups of logic signals comprising zero or one bits which provide ASCII or BCD code characters representative of the meter reading and meter identity.

Another aspect of the reader 2 is the ability to provide an ASCII or BCD code for meter identification where it is desired to read multiple meters. This is accomplished by on and off pulsing by the transmitter 64 of a carrier frequency wherein either the width of each one of the carrier frequency pulses determines a bit value of zero or one or the on or off state of the carrier determines a bit value of zero or one.

The reader 2 can be controlled and directed from an external computer 36 and can also transmit information to the external computer 36. The external computer 36 includes an RS232 interface which transmits information to and receives information from the microprocessor 38 and to and from the RAM 40 through the interface 60. A cable connector 92 is provided on the reader 2 for connecting the external computer 36 to the reader. The external computer 36 is required where the probe 10 or reading connector 18 of the reader 2 cannot be used and the meter must be read visually by the operator. Where a meter is read visually, the operator keys the reading into the external computer 36 and the data representative of the reading is stored therein. The external computer 36 is also used for purposes such as instructions to the operator as to what read process to execute for a particular meter, meter location, meter identification number, and type of meter. Also, the data representative of readings of meters that is stored in RAM 40 can be transferred out to the external computer 36.

The external computer 36 can also be used to program or reprogram the reader 2, that is, load a new program into the RAM 40. In this mode of operation, a second cable is used which is plugged into the cable connector 92. In the program loading mode of operation, the battery charger and detector 33 and charging and communication interface 30 are also activated to provide a DC voltage charge 60 to the battery supply 26. When the re-program mode decoder 21 receives both a charge signal from the interface 30 and a program signal from the external computer 36, it will respond by providing a program mode signal on line 96 to the microprocessor 38. The microprocessor then will change to a program load mode and use a load program stored in the ROM 42 to load the new program from the external computer 36 into the RAM 40.

It will be understood that the foregoing description of the present invention is for purposes of illustration only and that the invention is susceptible to a number of modifications or changes, none of which entail any departure from the spirit and scope of the present invention as defined in the hereto appended claims.

What is claimed is:

1. A reader for receiving data indicative of the reading of a utility meter, comprising:

means for inductively transmitting power to the meter at a frequency to which the utility meter will respond, said means being able to transmit power at a plurality of frequencies since different types of utility meters respond to different frequencies; and means for inductively receiving data from the meter represented by load modulation of the transmitted frequency, the transmitted frequency thereby having a modulation envelope.

2. The reader according to claim 1 wherein the transmitted power includes an interrogation signal.

3. The reader according to claim 1 further comprising selectable filter means for controlling the bandwidth of the modulation envelope.

4. The reader according to claim 1 further comprising means for inductively receiving data from the meter represented by an amplitude modulated frequency generated by the meter.

5. The reader according to claim 1 wherein the reader includes a primary battery supply connectable to an external battery charger and memory means for storing a program received from an external computer, the battery charger producing a battery charging signal when connected to the battery supply and the external computer producing a programming signal when transferring a program to the memory means, further comprising:

interface means responsive to a simultaneous battery charging signal and programming signal to produce a program mode signal; and microprocessor means for controlling the transfer of the program into the memory in response to the program mode signal.

6. The reader according to claim 5 further comprising a detachable probe having wire terminals directly connectable to the meter for receiving said data.

7. The reader according to claim 1 further comprising:

converter means for converting the data in the form of the modulation envelope to a digital data signal; and program means for controlling the operation of the converter means.

8. The reader according to claim 3 further comprising means for inductively receiving data from the meter represented by a frequency generated by the meter.

9. The reader according to claim 8 further comprising:
converter means for converting the data in the form of the modulated transmitted frequency to a digital data signal; and
program means for controlling the operation of the converter means.

10. The reader according to claim 8 wherein the reader includes a primary battery supply connectable to an external battery charger and memory means for storing a program received from an external computer, the battery charger producing a battery charging signal when connected to the battery supply and the external computer producing a programming signal when transferring a program to the memory means, further comprising:
interface means responsive to a simultaneous battery charging signal and programming signal to produce a program mode signal; and
microprocessor means for controlling the transfer of the program into the memory in response to the program mode signal.

11. The reader according to claim 8 further comprising:
a detachable probe having wire terminals directly connectable to the meter for receiving said data.

12. The reader according to claim 11 further comprising:
a random access memory; and
a secondary battery means for supplying power to the memory in the event of failure of the primary battery supply.

13. A reader for receiving data indicative of the reading of a utility meter, comprising:
means for inductively transmitting power at a selected frequency to the meter;
means for inductively receiving data from the meter represented by load modulation of the transmitted frequency; the frequency thereby having a modulation envelope; and
filter means for controlling the bandwidth of the modulation envelope.

14. The reader according to claim 13 further comprising:
converter means for converting the data in the form of the modulation envelope to a digital data signal; and
program means for controlling the operation of the converter means.

15. The reader according to claim 13 wherein the filter means has an adjustable low end frequency value whereby said bandwidth is controlled.

16. A reader for receiving data indicative of the reading of a utility meter having a register containing the data, comprising:
means for inductively transmitting power at a selected frequency to the register at a frequency to which the register will respond, said means being able to transmit power at a plurality of frequencies since different types of utility meters respond to different frequencies;
first means for inductively receiving data from the register in the form of load modulation of the transmitted frequency; the frequency thereby having a modulation envelope; and
second means for inductively receiving data from the register in the form of an amplitude modulated frequency generated by the meter.

17. The reader according to claim 16 further comprising filter means for controlling the bandwidth of the load modulation envelope.

18. A reader for receiving data representative of the reading of a utility meter, comprising:
means for inductively transmitting an interrogation signal to the meter in any selected one of a plurality of formats;
means for inductively receiving from the meter any one of a plurality of data formats determined by the format of the interrogation signal and representative of reading data of the meter; and
microprocessor and program means for controlling the selection of the interrogation signal format and decoding the reading data in any one of the data formats.

19. A reader for receiving data indicative of the reading of a utility meter having a register containing the data, comprising:
means for inductively transmitting an interrogation signal to the meter at a frequency to which the utility meter will respond, said means being able to transmit the interrogation signal at a plurality of frequencies since different types of utility meters respond to different frequencies,;
means for generating and transmitting at the meter a data signal representative of the meter reading data; and
means for inductively receiving the data signal from the meter.

20. The reader according to claim 19 wherein the interrogation signal has a plurality of selectable formats.

21. A method for reading a utility meter comprising the steps of:
transmitting electrical power from a reader antenna to the meter;
selecting the frequency at which the power is transmitted from a plurality of frequencies the reader is capable of transmitting, wherein different meters respond to different frequencies;
load modulating the transmitted power to represent the meter reading; and
sensing the variations in the electrical power being transmitted as a result of the modulation to determine the meter reading.

22. The method according to claim 17 further comprising the steps of:
converting the variations in the modulation envelope of the transmitted power from an analog to a digital form; and
controlling the converting with a program.

23. The method according to claim 17 further comprising:
alternatively to the step of modulating the frequency of the transmitted power, storing the transmitted power at the meter;
transmitting to the reader antenna a frequency signal varying to represent the meter reading from an antenna at the meter using the transmitted power stored at the meter; and
sensing the varying frequency signal to determine the meter reading.

24. The method according to claim 19 further comprising the steps of:
converting the variations in the modulated frequency from an analog to a digital form; and
controlling the converting with a program.

25. The method according to claim 17 further comprising the step of controlling the bandwidth of the modulation envelope of the transmitted power.

* * * * *